(12) United States Patent
Moon et al.

(10) Patent No.: US 8,643,019 B2
(45) Date of Patent: Feb. 4, 2014

(54) ORGANIC LIGHT EMITTING DISPLAY DEVICE AND MANUFACTURING METHOD FOR THE SAME

(75) Inventors: Sang-Ho Moon, Yongin (KR); Chun-Gi You, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 41 days.

(21) Appl. No.: 13/240,874

(22) Filed: Sep. 22, 2011

(65) Prior Publication Data

US 2012/0146060 A1 Jun. 14, 2012

(30) Foreign Application Priority Data

Dec. 8, 2010 (KR) .......................... 10-2010-0124862

(51) Int. Cl.
*H01L 29/12* (2006.01)
(52) U.S. Cl.
USPC ............................................. 257/71; 257/59
(58) Field of Classification Search
USPC ................. 257/57, 59, 66, 72, 359, 390, 443, 257/E21.411, E21.412, E51.005, E27.1, 257/E29.117, E29.151, 40, 71, 158, 257/E33.053; 438/30, 149, 158–159; 349/43
See application file for complete search history.

(56) References Cited

U.S. PATENT DOCUMENTS

| | | | |
|---|---|---|---|
| 2005/0110023 A1* | 5/2005 | Lee et al. | 257/72 |
| 2010/0109013 A1 | 5/2010 | Ahn et al. | |
| 2010/0193790 A1* | 8/2010 | Yeo et al. | 257/59 |
| 2011/0084257 A1 | 4/2011 | Kwon et al. | |
| 2011/0108848 A1* | 5/2011 | Lee et al. | 257/72 |
| 2011/0156578 A1* | 6/2011 | Jeon et al. | 313/506 |

FOREIGN PATENT DOCUMENTS

| | | |
|---|---|---|
| KR | 10-2008-0046635 | 5/2008 |
| KR | 10-2009-0082685 | 7/2009 |
| KR | 10-2009-0096337 | 9/2009 |
| KR | 1020090120698 | 11/2009 |
| KR | 10-2010-0049978 | 5/2010 |
| KR | 1020110039061 | 4/2011 |

* cited by examiner

*Primary Examiner* — Steven Loke
*Assistant Examiner* — Mouloucoulaye Inoussa
(74) *Attorney, Agent, or Firm* — Robert E. Bushnell, Esq.

(57) ABSTRACT

An organic light emitting display device may comprises a thin film transistor including an active layer, a gate electrode including a gate lower electrode and a gate upper electrode, a source electrode, a drain electrode, and an organic light emitting device electrically connected to the thin film transistor. A pixel electrode formed of the same material and in the same layer as the gate lower electrode, an intermediate layer including a light emitting layer, and an opposed electrode are sequentially deposited. A first pad electrode is formed in the same layer as the gate lower electrode, a second pad electrode is formed on at least a part of the first pad electrode and in the same layer as the gate upper electrode, and a third pad electrode contacts at least a part of the second pad electrode and is formed in the same layer as the source electrode.

21 Claims, 6 Drawing Sheets

ORGANIC LIGHT EMITTING DISPLAY DEVICE AND MANUFACTURING METHOD FOR THE SAME

CLAIM OF PRIORITY

This application makes reference to, incorporates the same herein, and claims all benefits accruing under 35 U.S.C. §119 from an application earlier filed in the Korean Intellectual Property Office on Dec. 8, 2010 and there duly assigned Serial No. 10-2010-0124862.

BACKGROUND OF THE INVENTION

1. Field of the Invention

The present invention relates to an organic light emitting display device and a manufacturing method thereof, and more particularly, to an organic light emitting display device having a simplified manufacturing process and improved resistance uniformity in a pad portion so that luminance is improved, and a method of manufacturing the organic light emitting display device.

2. Description of the Related Art

Flat panel display devices, such as organic light emitting display devices or liquid crystal display devices, are manufactured on a substrate on which a pattern, including thin film transistors (TFTs), capacitors, and wiring connecting the TFTs and capacitors, is formed. In general, to form a fine pattern including TFTs on a substrate on which a flat panel display device is manufactured, the pattern is transferred to the substrate by using a mask where the fine pattern is formed.

A process to transfer a pattern using a mask generally uses a photolithography process. According to the photolithography process, including a series of sub-steps, photoresist is uniformly coated on a substrate on which a pattern is to be formed. The photoresist is exposed to light using exposure equipment, such as a stepper. In the case of positive photoresist, the exposed photoresist is developed. After the photoresist is developed, the pattern is etched using the remaining photoresist as a mask, thereby removing unnecessary photoresist.

In the process of transferring a pattern using a mask, a mask having a necessary pattern thereon is needed. Accordingly, as the number of steps in which a mask is used increases, manufacturing cost for preparing the mask increases. Also, since the above-described complicated steps are needed, the manufacturing process is complicated, manufacturing time is extended, and manufacturing cost rises.

SUMMARY OF THE INVENTION

To solve the above and/or other problems, the present invention provides an organic light emitting display device having a simplified manufacturing process and improved resistance uniformity in a pad portion so that luminance is improved, and a method of manufacturing the organic light emitting display device.

According to an aspect of the present invention, an organic light emitting display device comprises: a thin film transistor including an active layer, a gate electrode including a gate lower electrode and a gate upper electrode, a source electrode, and a drain electrode; an organic light emitting device electrically connected to the thin film transistor, wherein a pixel electrode formed of the same material and in the same layer as the gate lower electrode, an intermediate layer including a light emitting layer, and an opposed electrode are sequentially deposited; a first pad electrode formed of the same material and in the same layer as the gate lower electrode; a second pad electrode formed on at least a part of the first pad electrode and formed of the same material and in the same layer as the gate upper electrode; and a third pad electrode contacting at least a part of the second pad electrode and formed of the same material and in the same layer as the source electrode.

The organic light emitting display device further includes an interlayer insulation layer interposed between the second pad electrode and the third pad electrode, wherein the second pad electrode and the third pad electrode contact each other via a contact hole formed in the interlayer insulation layer.

The interlayer insulation layer may expose one end portion of the second pad electrode, and the third pad electrode maybe formed along the interlayer insulation layer and may contact one end portion of the exposed second pad electrode.

Both end portions of the third pad electrode may respectively contact both end portions of the second pad electrode.

One end portion of the first pad electrode may be exposed to the outside and may be electrically connected to a driver IC which supplies current to drive the organic light emitting display device.

The gate lower electrode, the pixel electrode, and the first pad electrode may include at least one of ITO, IZO, ZnO, and $In_2O_3$.

The gate upper electrode and the second pad electrode may include at least one material selected from a group consisting of Ag, Mg, Al, Pt, Pd, Au, Ni, Nd, Ir, Cr, Li, Ca, Mo, Ti, W, MoW, and Al/Cu.

The gate upper electrode and the second pad electrode may include a tri-layer structure of molybdenum (Mo)-aluminum (Al)-molybdenum (Mo).

The source electrode, the drain electrode, and the third pad electrode may include at least one material selected from a group consisting of Ag, Mg, Al, Pt, Pd, Au, Ni, Nd, Ir, Cr, Li, Ca, Mo, Ti, W, MoW, and Al/Cu.

The source electrode, the drain electrode, and the third pad electrode may include a tri-layer structure of molybdenum (Mo)-aluminum (Al)-molybdenum (Mo).

According to another aspect of the present invention, an organic light emitting display device comprises: a first insulation layer formed on a substrate; an active layer of a thin film transistor formed on the first insulation layer; a second insulation layer covering the active layer; a pixel electrode formed on the second insulation layer; a gate lower electrode formed of the same material and in the same layer as the pixel electrode above the active layer by being separated a predetermined distance from the pixel electrode; a first pad electrode formed of the same material and in the same layer as the gate lower electrode by being separated a predetermined distance from the gate lower electrode; a gate upper electrode formed on the gate lower electrode; a second pad electrode formed of the same material and in the same layer as the gate upper electrode on the first pad electrode; a third insulation layer covering at least a part of the pixel electrode, the gate upper electrode, and the second pad electrode; source and drain electrodes formed on the third insulation layer and contacting the pixel electrode; and a third pad electrode formed of the same material and in the same layer as the source and drain electrodes and contacting the second pad electrode.

The second pad electrode and the third pad electrode may contact each other via a contact hole formed in the third insulation layer.

The third insulation layer may expose one end portion of the second pad electrode, and the third pad electrode may be formed along the third insulation layer and may contact the exposed end portion of the second pad electrode.

Both end portions of the third pad electrode may respectively contact both end portions of the second pad electrode.

According to another aspect of the present invention, a method of manufacturing an organic light emitting display device comprises: a first mask process operation for forming an active layer of a thin film transistor on a substrate; a second mask process operation for forming a gate electrode, a first pad electrode, a second pad electrode, and an electrode pattern which forms a pixel electrode above the active layer; a third mask process operation for forming an interlayer insulation layer having an opening which exposes both sides of the active layer, a part of the second pad electrode, and a part of the electrode pattern; a fourth mask process operation for forming source and drain electrodes contacting both exposed sides of the active layer, a third pad electrode contacting an exposed part of the second pad electrode, and the pixel electrode; and a fifth mask process operation for forming a pixel define layer which exposes at least a part of the pixel electrode.

The second mask process operation may include sequentially depositing a second insulation layer, a first conductive layer and a second conductive layer on the active layer, forming the gate electrode including the first conductive layer as a gate lower electrode and the second conductive layer as a gate upper electrode, and simultaneously forming a pad electrode including the first conductive layer as a first pad electrode and the second conductive layer as a second pad electrode by patterning the first conductive layer and the second conductive layer.

The third mask process operation may include depositing a third insulation layer on the gate electrode, the second pad electrode and the electrode pattern, and forming an opening which exposes parts of source and drain regions of the active layer, a part of the second pad electrode, and a part of the electrode pattern, by patterning the third insulation layer.

The fourth mask process operation may include depositing a third conductive layer on an upper surface of the interlayer insulation layer, and forming the source and drain electrodes and the third pad electrode by patterning the third conductive layer.

The second pad electrode and the third pad electrode may contact each other via a contact hole formed in the interlayer insulation layer.

The interlayer insulation layer may expose one end portion of the second pad electrode, and the third pad electrode maybe formed along the interlayer insulation layer and may contact the exposed end portion of the second pad electrode.

The fifth mask process operation may include depositing a fourth insulation layer on an entire surface of the substrate, and forming the pixel define layer by patterning the fourth insulation layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
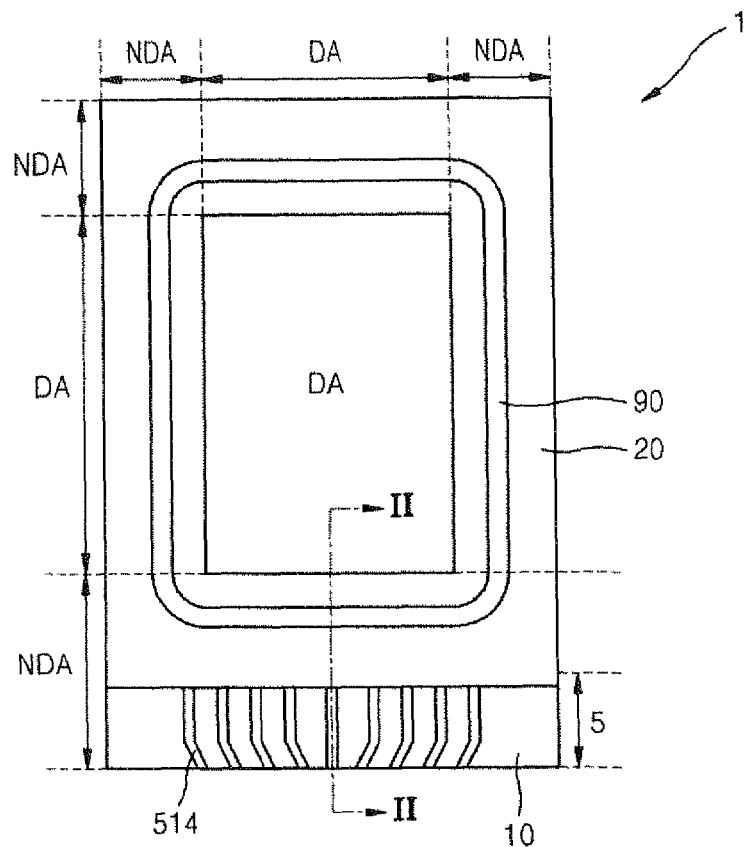
FIG. 1 is a plan view schematically illustrating the structure of an organic light emitting display device according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

FIG. 1 is a plan view schematically illustrating the structure of an organic light emitting display device according to an embodiment of the present invention.

Referring to FIG. 1, the organic light emitting display device 1 according to the present embodiment comprises a first substrate 10 including a thin film transistor (TFT) and a light emitting pixel, and a second substrate 20 which is coupled to the first substrate 10 via sealing.

The TFT, an organic electroluminescent device EL, and a storage capacitor Cst may be formed on the first substrate 10. Also, the first substrate 10 may be a low temperature poly silicon (LTPS) substrate, a glass substrate, a plastic substrate, or a stainless using steel (SUS) substrate.

The second substrate 20 may be an encapsulation substrate which is arranged on top of the first substrate 10 so as to shield the TFTs and the light emitting pixels provided on the first substrate 10 from external moisture or air. The second substrate 20 is disposed to face the first substrate 10, and the first and second substrates 10 and 20, respectively, are combined with each other via a sealing member 90 which is arranged along the edge thereof. The second substrate 20 may be a transparent glass or plastic substrate.

The first substrate 10 includes a light emitting area DA from which light is emitted and a non-light emitting area NDA which is disposed outside the light emitting area DA. According to the embodiments of the present invention, as the sealing member 90 is arranged in the non-light emitting area NDA outside the light emitting area DA, the first and second substrates 10 and 20, respectively, are combined together.

As described above, the EL, the TFT which drives the EL, and wiring electrically connected to the components are formed in the light emitting area DA of the first substrate 10. The non-light emitting area NDA may include a pad area 5 where a pad electrode extending from the wiring of the light emitting area DA is disposed.

Figure 2:
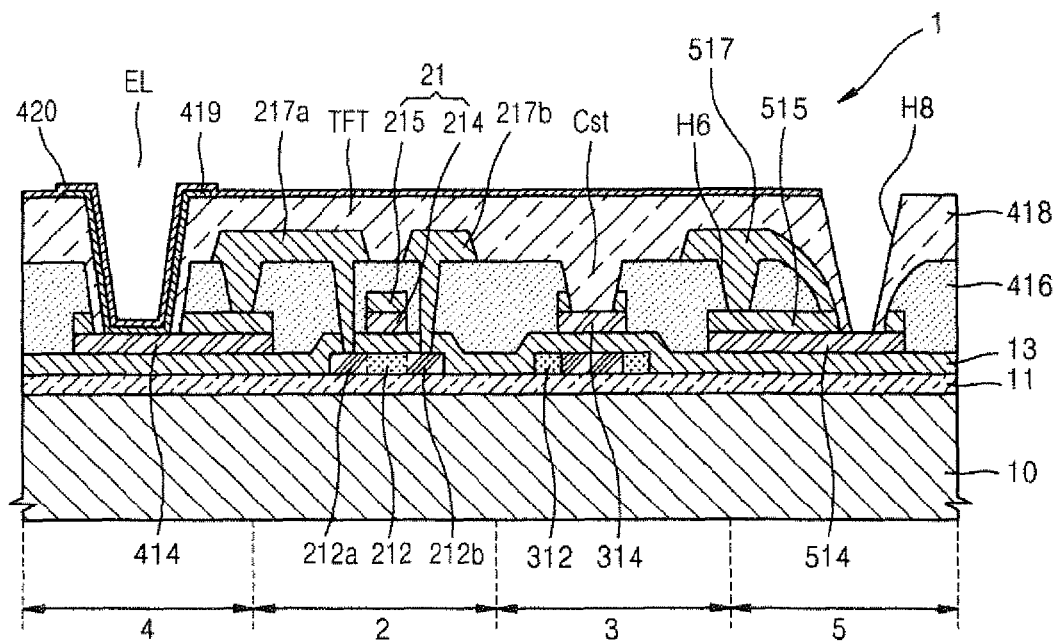
FIG. 2 is a cross-sectional view taken along a line II-II of FIG. 1.

FIG. 2 is a cross-sectional view taken along a line II-II of FIG. 1.

Referring to FIG. 2, the organic light emitting display device 1 according to the present embodiment includes a channel area 2, a storage area 3, a light emitting area 4, and a pad area 5.

In the organic light emitting display device according to the present embodiment, the pad area 5 characteristically includes a first pad electrode 514, a second pad electrode 515, and a third pad electrode 517. The structure of the pad area 5 having the above structure will be described below in detail.

A TFT is provided as a driving device in the channel area 2. The TFT includes an active layer 212, a gate electrode 21, and source and drain electrodes 217a and 217b, respectively. The gate electrode 21 includes a gate lower electrode 214 and a gate upper electrode 215. The gate lower electrode 214 may be formed of a transparent conductive material. A second insulation layer 13 for providing insulation between the gate electrode 21 and the active layer 212 is provided therebetween. Source and drain regions 212a and 212b, respectively, in which high concentration impurities are injected are formed at both sides of the active layer 212 and are respectively connected to the source and drain electrodes 217a and 217b, respectively.

The storage capacitor Cst is provided in the storage area 3. The storage capacitor Cst includes a capacitor lower electrode 312 and a capacitor upper electrode 314. The second insulation layer 13 is interposed between the capacitor lower electrode 312 and the capacitor upper electrode 314. The capacitor lower electrode 312 maybe formed of the same material as the active layer 212 of the TFT in the same layer. The capacitor upper electrode 314 may be formed of the same material as the gate lower electrode 214 of the TFT, a pixel electrode 414 of the EL, and the first pad electrode 514 in the same layer.

The EL is provided in the light emitting area 4. The EL includes the pixel electrode 414 connected to one of the source and drain electrodes 217a and 217b, respectively, of the TFT, an opposed electrode 420 facing the pixel electrode 414, and an intermediate layer 419 interposed between the pixel electrode 414 and the opposed electrode 420. The pixel electrode 414 may be formed of a transparent conductive material, and may be formed of the same material as the gate lower electrode 214 of the TFT and the first pad electrode 514 in the same layer.

The pad area 5 includes the first pad electrode 514, the second pad electrode 515, and the third pad electrode 517. The first pad electrode 514 may be formed of the same material as the gate lower electrode 214 of the TFT, the capacitor upper electrode 314, and the pixel electrode 414 of the EL in the same layer. Furthermore, the second pad electrode 515 may be formed of the same material as the gate upper electrode 215 in the same layer. Also, the third pad electrode 517 may be formed of the same material as the source and drain electrodes 217a and 217b, respectively, in the same layer.

The pad area 5 will be described below in detail. In a conventional organic light emitting display device, there has been an effort to form a pad electrode having a structure in which a second conductive layer, including molybdenum (Mo)-aluminum (Al)-molybdenum (Mo), is formed on an upper surface of one side of a first conductive layer including ITO. The pad electrode having the above structure is formed by performing batch etching of the second conductive layer forming a gate upper gate and the third conductive layer forming source and drain electrodes. However, during the batch etching, metal undercut is generated under an interlayer insulation layer due to skew of the second conductive layer. Accordingly, an additional resistance component corresponding to the skew is generated due to the metal undercut. As a result, a voltage drop is generated before current supplied through a drive IC enters into a panel, and thus luminance is lowered. Also, the skew of the second conductive layer may vary according to the thickness of the second conductive layer. A skew difference may be generated according to a position in spite of the same thickness so that the amount of current entering into the panel may vary according to the position of a pad electrode. Accordingly, uniformity in the luminance of a pad electrode is lowered so that long range uniformity (LRU) dispersion may be generated.

To address the above issue, in the organic light emitting display device according to the present embodiment, an opening H6 which performs the function of a contact hole is formed in an interlayer insulation layer 416, and the second pad electrode 515 formed of a second conductive layer 15 (refer to FIG. 5) and the third pad electrode 517 formed of a third conductive layer 17 (refer to FIG. 5) are connected by the opening H6. At the same time, the end portions of the second pad electrode 515 and the third pad electrode 517 are connected to each other by patterning the third pad electrode 517 to the end portion of the second pad electrode 515. According to the above structure, the generation of a metal undercut under the interlayer insulation layer 416 during the batch etching of the second and third conductive layers 15 and 17, respectively, may be basically prevented. Thus, according to the present invention, the effect of preventing the additional voltage drop and the generation of dispersion of resistance according to the position of a pad electrode due to metal undercut may be obtained.

A process of manufacturing the bottom emission type organic light emitting display device of FIG. 2 will be described below.

FIGS. 3-11 are cross-sectional views for schematically illustrating a process of manufacturing the organic light emitting display device of FIG. 2.

Figure 3:
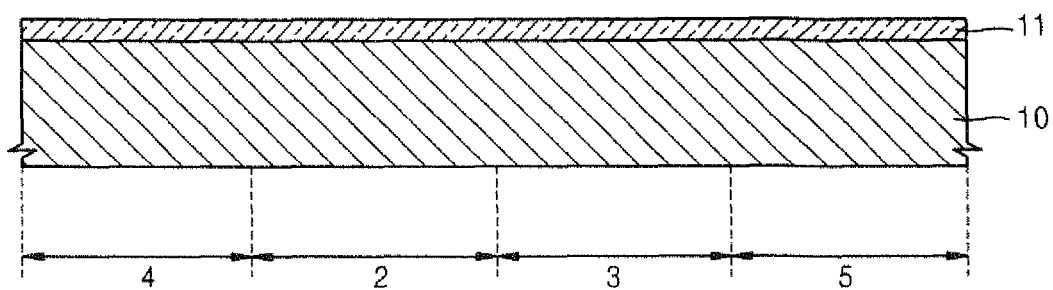
FIGS. 3 thru 11 are cross-sectional views for schematically illustrating a process of manufacturing the organic light emitting display device of FIG. 2.

First, as illustrated in FIG. 3, a first insulation layer 11 is formed on the substrate 10. In detail, the first substrate 10 may be formed of a transparent glass material having a main component of SiO2. The substrate 10 is not limited thereto and a variety of substrates formed of various materials such as a transparent plastic material or a metal member may be used.

The first insulation layer 11, such as a barrier layer and/or a buffer layer for preventing diffusion of impurity ions, preventing intrusion of moisture or external air, and planarizing a surface of the substrate 10, may be provided on an upper surface of the substrate 10. The first insulation layer 11 may be deposited using SiO2 and/or $SiN_x$ by various deposition methods, such as a plasma enhanced chemical vapor deposition (PECVD) method, an atmospheric pressure CVD (APCVD) method, or a lower pressure CVD (LPCVD) method.

Figure 4:
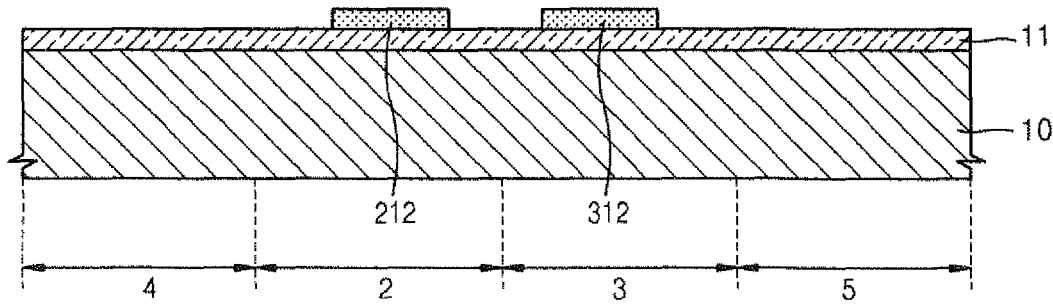

Next, as illustrated in FIG. 4, the active layer 212 of the TFT and the capacitor lower electrode 312 of the storage capacitor Cst are formed on an upper surface of the first insulation layer 11. In detail, amorphous silicon is first deposited on the upper surface of the first insulation layer 11, and then the amorphous silicon is crystallized to form a polycrystal silicon layer (not shown). The amorphous silicon may be crystallized by a variety of methods, such as a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method. The polycrystal silicon layer is patterned into the active layer 212 of the TFT and the capacitor lower electrode 312 of the storage capacitor Cst via a mask process using a first mask (not shown).

Figure 5:
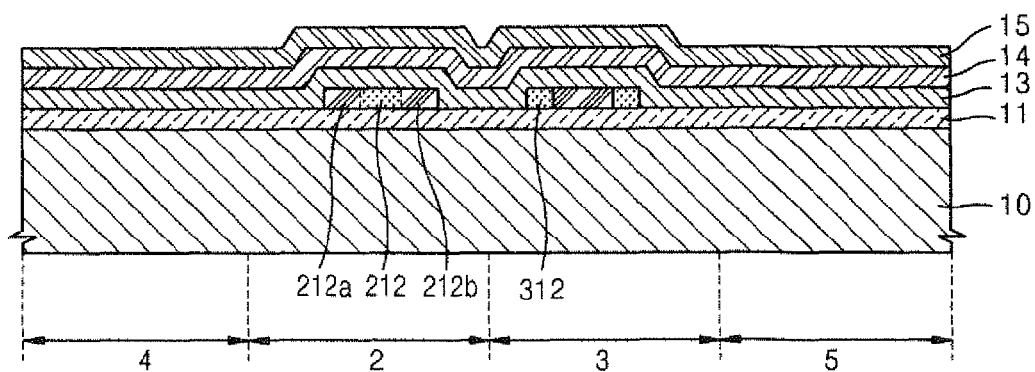

In the present embodiment, the active layer 212 and the capacitor lower electrode 312 are formed separately from each other, but the active layer 212 and the capacitor lower electrode 312 may be formed in one body. Next, as illustrated in FIG. 5, the second insulation layer 13, a first conductive layer 14, and a second conductive layer 15 are sequentially deposited on the entire surface of the substrate 10 where the active layer 212 and the capacitor lower electrode 312 are formed.

The second insulation layer 13 maybe formed by depositing an inorganic insulation layer, such as $SiN_x$ or $SiO_x$, in a method such as a PECVD method, an APCVD method, or an LPCVD method. The second insulation layer 13 is interposed between the active layer 212 and the gate electrode 21 of the TFT (see FIG. 6 discussed below) and functions as a gate insulation layer of the TFT. The second insulation layer 13 is also interposed between the capacitor upper electrode 314 (see FIG. 6 discussed below) and the capacitor lower electrode 312, and functions as a dielectric layer of the storage capacitor Cst.

The first conductive layer 14 may include one or more materials selected from a group consisting of transparent materials including ITO, IZO, ZnO, or $In_2O_3$. The first conductive layer 14 may be patterned later into the pixel electrode 414, the gate lower electrode 214, the capacitor upper electrode 314, and the first pad electrode 514 (see FIG. 6 discussed below).

The second conductive layer 15 may include one or more materials selected from a group consisting of Ag, Mg, Al, Pt, Pd, Au, Ni, Nd, Ir, Cr, Li, Ca, Mo, Ti, W, MoW, and Al/Cu. The second conductive layer 15 may be patterned into a tri-layer structure of molybdenum (Mo)-aluminum (Al)-molybdenum (Mo). The second conductive layer 15 may be patterned later into the gate upper electrode 215 and the second pad electrode 515 (see FIG. 6 discussed below).

Figure 6:
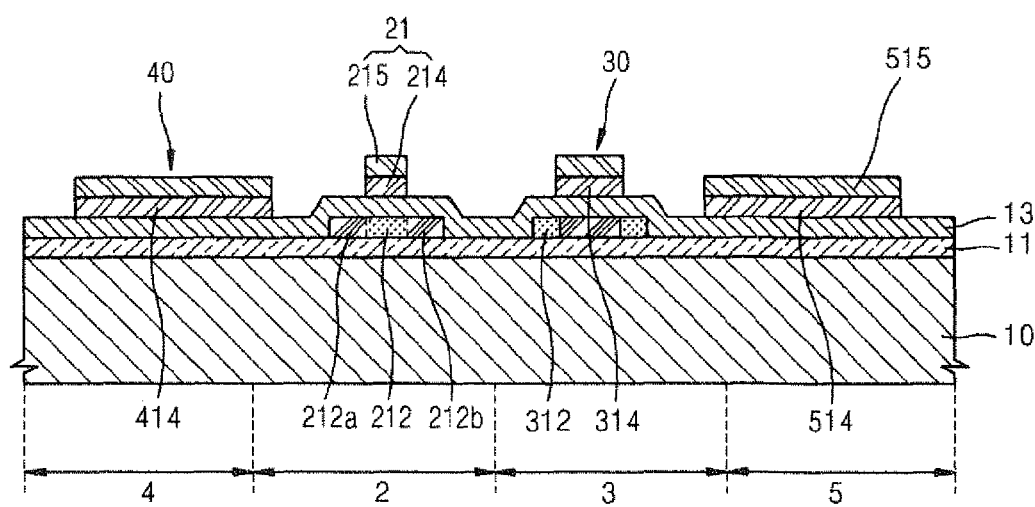

Next, as illustrated in FIG. 6, the gate electrode 21, electrode patterns 30 and 40, the first pad electrode 514, and the second pad electrode 515 are formed on the substrate 10. In detail, the first conductive layer 14 and the second conductive layer 15, which are sequentially deposited on the entire surface of the substrate 10, are patterned by a mask process using a second mask (not shown).

The gate electrode 21 is formed on an upper surface of the active layer 212 in the channel area 2. The gate electrode 21 includes the gate lower electrode 214 constituting a part of the first conductive layer 14 and the gate upper electrode 215 constituting a part of the second conductive layer 15. The gate electrode 21 is formed in correspondence to the center of the active layer 212. The source and drain regions 212a and 212b, respectively, are formed at both edges of the active layer 212 corresponding to both sides of the gate electrode 21 by doping n-type or p-type impurities in the active layer 212 using the gate electrode 21 as a mask, and the channel area 2 is formed between the source and drain regions 212a and 212b, respectively.

The electrode pattern 30 for forming the capacitor upper electrode 314 later is formed on an upper surface of the capacitor lower electrode 312 in the storage area 3. The electrode pattern 40 for forming the pixel electrode 414 later is formed in the light emitting area 4. The first pad electrode 514 formed as a part of the first conductive layer 14 and the second pad electrode 515 formed as a part of the second conductive layer 15 are formed in the pad area 5.

Figure 7:
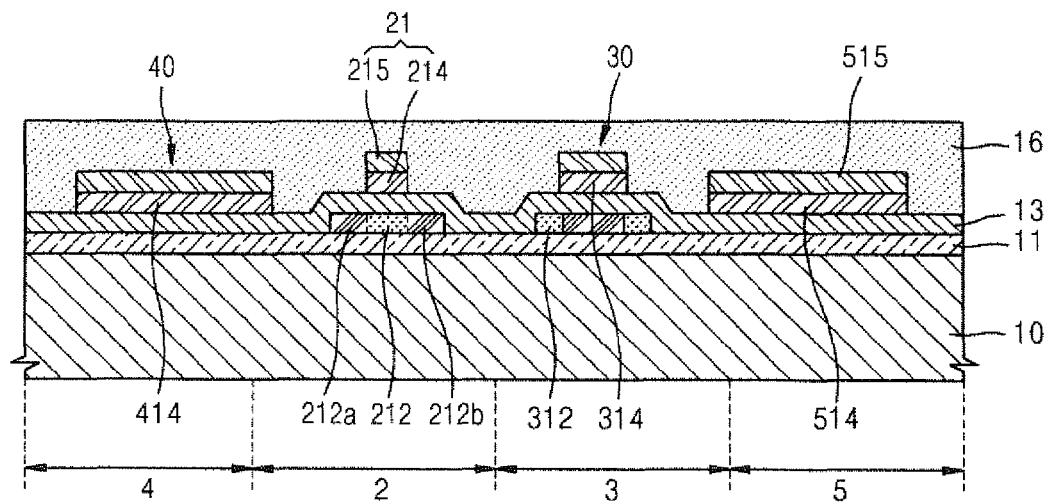

Next, as illustrated in FIG. 7, a third insulation layer 16 is deposited on the entire surface of the substrate 10 where the gate electrode 21 is formed. The third insulation layer 16 is formed by a method such as spin coating from one or more organic insulation materials selected from a group consisting of polyimide, polyamide, acryl resin, benzocyclobutene, and phenol resin. The third insulation layer 16 is formed to a sufficient thickness, for example, so as to be thicker than the second insulation layer 13, and functions as the interlayer insulation layer 416 between the gate electrode 21 and the source and drain electrodes 217a and 217b, respectively, of the TFT. The third insulation layer 16 may be formed of not only the above-described organic insulation material but also an inorganic insulation material such as the second insulation layer 13, or may be formed by alternately arranging an organic insulation material and an inorganic insulation material.

Figure 8:
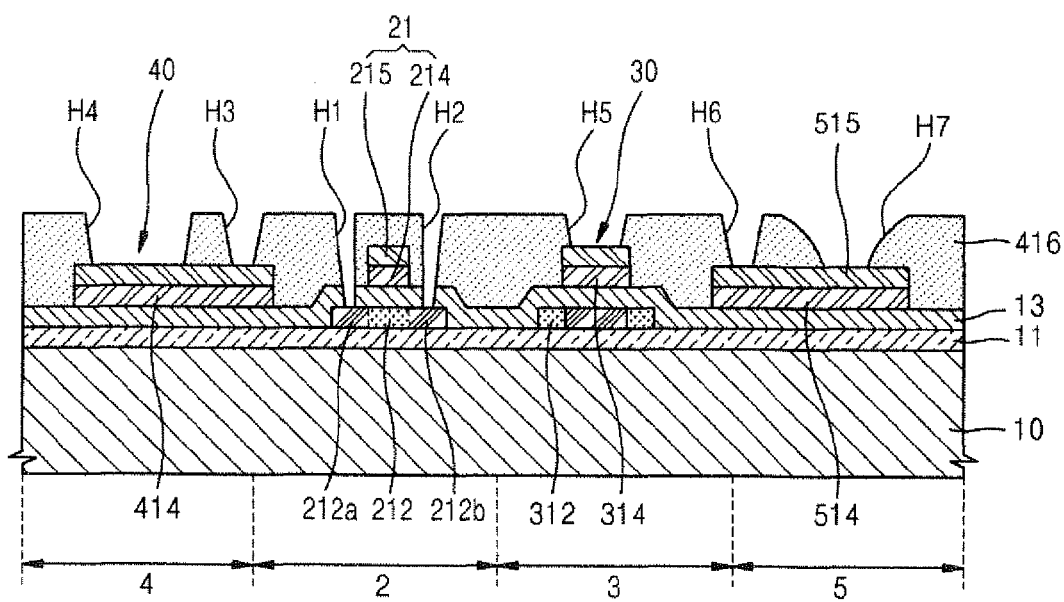

Next, as illustrated in FIG. 8, the interlayer insulation layer 416 having openings H1, H2, H3, H4, H5, H6, and H7 for exposing parts of the electrode patterns 30 and 40, the second pad electrode 515, and the source and drain regions 212a and 212b, respectively, is formed by patterning the third insulation layer 16. In detail, the third insulation layer 16 is patterned by a mask process using a third mask (not shown), thereby forming the openings H1, H2, H3, H4, H5, H6, and H7. The openings H1 and H2 expose parts of the source and drain regions 212a and 212b, respectively. The openings H3 and H4 expose a part of the second conductive layer 15 constituting the upper portion of the electrode pattern 40. The opening H5 exposes a part of the second conductive layer 15 constituting the upper portion of the electrode pattern 30. The openings H6 and H7 expose a part of the second pad electrode 515.

Figure 9:
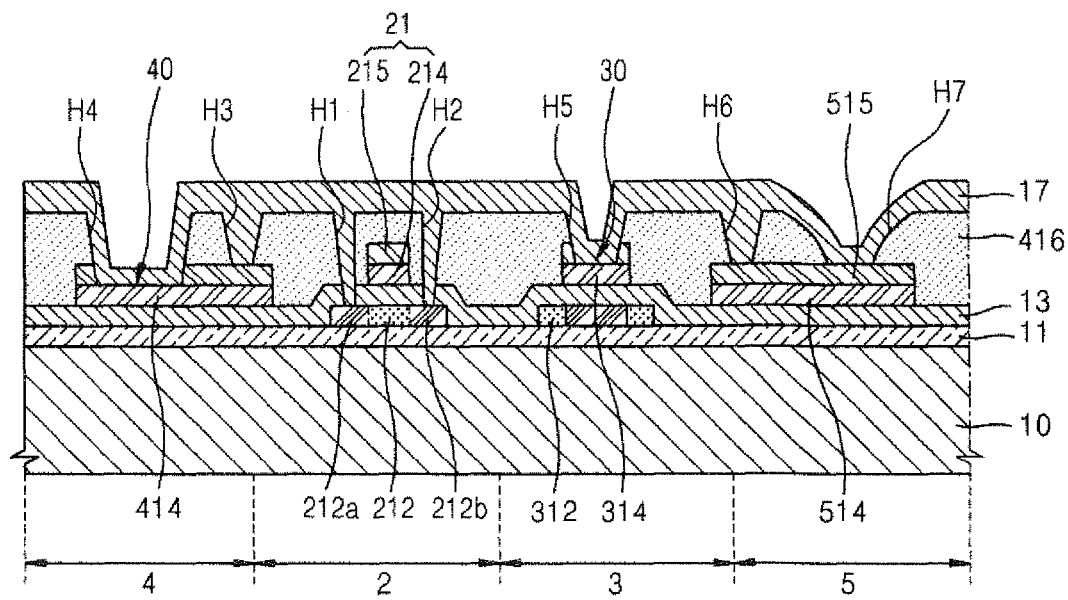

Next, as illustrated in FIG. 9, the third conductive layer 17 is deposited on the entire surface of the substrate 10 so as to cover the interlayer insulation layer 416. The third conductive layer 17 may be formed of the same conductive material as the above-described first or second conductive layer 14 or 15, respectively. However, the present invention is not limited thereto and the third conductive layer 17 may be formed of one selected from a variety of conductive materials. The conductive material is deposited to a thickness sufficient to fill at least a part of the above-described openings H1, H2, H3, H4, H5, H6, and H7.

Figure 10:
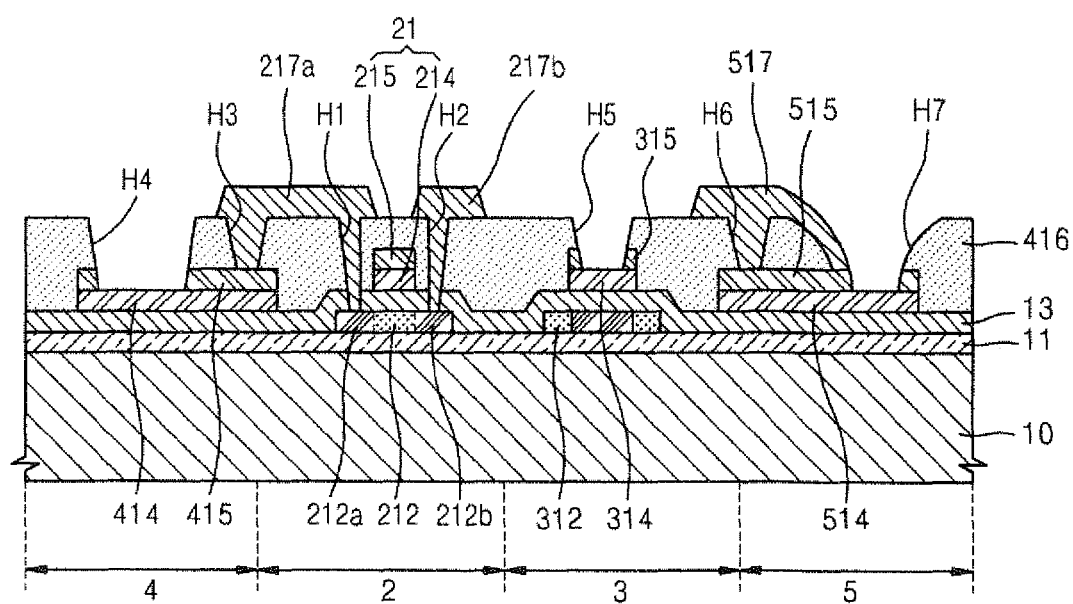

Next, as illustrated in FIG. 10, the source and drain electrodes 217a and 217b, respectively, the pixel electrode 414, the capacitor upper electrode 314, and the third pad electrode 517 are formed by patterning the third conductive layer (refer to element 17 of FIG. 9). In detail, the source and drain electrodes 217a and 217b, respectively, and the third pad electrode 517 are formed by patterning the third conductive layer (refer to element 17 of FIG. 9) in a mask process using a fourth mask (not shown). One of the source and drain electrodes 217a and 217b, respectively, that is, the source electrode 217a in the present embodiment, is connected to the pixel electrode 414 via the opening H3 at the edge area of an upper second conductive layer 415 of the electrode pattern (refer to element 40 of FIG. 9) where the pixel electrode 414 is to be formed.

One end portion of the third pad electrode 517 is formed along the opening H7 and is connected to the second pad electrode 514. That is, one end portion of the third pad electrode 517 is connected to the second pad electrode 514 via the opening H6. The other end portion of the third pad electrode 517 is formed along the opening H7, and is connected to the second pad electrode 514. Thus, both end portions of the third pad electrode 517 are connected to the second pad electrode 514.

According to the above structure, the generation of a metal undercut under the interlayer insulation layer 416 during the etching of the second conductive layer 15 may be basically prevented. Thus, the effect of preventing an additional voltage drop and the generation of dispersion of resistance according to the position of a pad electrode due to metal undercut may be obtained.

After the source and drain electrodes 217a and 217b, respectively, are formed, the pixel electrode 414 and the capacitor upper electrode 314 are formed by additional etching. In detail, the pixel electrode 414 is formed by removing the second conductive layer 415, which is exposed by the opening H4, of the electrode pattern (refer to element 40 of FIG. 9). The capacitor upper electrode 314 is formed by removing the second conductive layer 315, which is exposed by the opening H5, of the electrode pattern (refer to element 30 of FIG. 9). The first pad electrode 514 is formed by removing the second conductive layer 515, which is exposed by the opening H6, of the electrode pattern (refer to element 50 of FIG. 9).

Thus, the gate lower electrode 214, the capacitor upper electrode 314, the pixel electrode 414, and the first pad electrode 514 are formed of the same material and in the same layer. The capacitor lower electrode 312 may be doped by injecting n-type or p-type impurities through the opening H5. The impurities injected during doping may be the same as or different from one used during the doping of the active layer 212.

Figure 11:
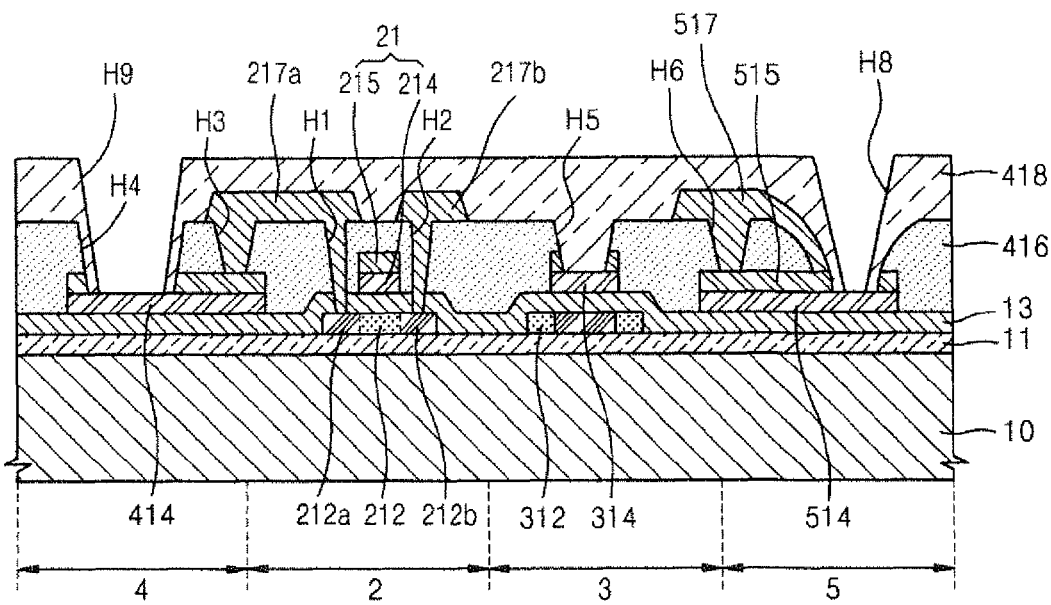

Next, as illustrated in FIG. 11, a pixel define layer (PDL) 418 is formed on the substrate 10. In detail, a fourth insulation layer (not shown) is deposited on the entire surface of the substrate 10 where the pixel electrode 414, the source and drain electrodes 217a and 217b, respectively, the capacitor upper electrode 314, and the third pad electrode 517 are formed. The fourth insulation layer may be formed of one or more organic insulation materials selected from a group consisting of polyimide, polyamide, acryl resin, benzocyclobutene, and phenol resin in a method such as spin coating. Also, the fourth insulation layer may be formed of an inorganic insulation material selected from a group consisting of $SiO_2$, $SiN_x$, $Al_2O_3$, $CuO_x$, $Tb_4O_7$, $Y_2O_3$, $Nb_2O_5$, an above organic insulation material. The fourth insulation layer may be formed in a multilayer structure in which the organic insulation material and the inorganic insulation material are alternately arranged.

The PDL 418 for defining a pixel is formed by patterning the fourth insulation layer in a mask process using a fifth mask (not shown) to form an opening H9 which exposes the center portion of the pixel electrode 414, and simultaneously an opening H8 which exposes the center portion of the first pad electrode 514.

Then, as illustrated in FIG. 2, the intermediate layer 419 (including an organic light emitting layer EL) and the opposed electrode 420 are formed in the opening H9 which exposes the pixel electrode 414. The intermediate layer 419 may be formed in a single or combined structure including at least one function layer such as an emissive layer EML, and at least one other function layer such as a hole transport layer HTL, a hole injection layer HIL, an electron transport layer ETL, and an electron injection layer EIL.

The intermediate layer 419 may be formed of a low molecule organic material or a polymer organic material. When the intermediate layer 419 is formed of a low molecule organic material, in the intermediate layer 419, the HTL and the HIL are deposited in a direction toward the pixel electrode 414 with respect to the organic light emitting layer and the ETL and the EIL are deposited in a direction toward the opposed electrode 420 with respect to the organic light emitting layer. Also, a variety of layers may be deposited as necessary. A usable organic material may include copper phthalocyanine (CuPc), N,N'-Di(naphthalene-1-yl)-N,N'-diphenyl-benzidine (NPB), or tris-8-hydroxyquinoline aluminum (Alq3).

When the intermediate layer 419 is formed of a polymer organic material, in the intermediate layer 419, the HTL may only be included in a direction to the pixel electrode 414 with respect to the organic light emitting layer. The HTL may be formed on an upper surface of the pixel electrode 414 by a method such as inkjet printing or spin coating using poly-(2, 4)-ethylene-dihydroxy thiophene (PEDOT) or polyaniline (PANI). A usable organic material may include a poly-phenylenevinylene (PPV) based or polyfluorene based polymer organic material. A color pattern may be formed by a typical method such as inkjet printing, spin coating, or thermal transfer method using laser.

The opposed electrode 420 may be formed as a common electrode by being deposited on the entire surface of the substrate 10. In the organic light emitting display device according to the present embodiment, the pixel electrode 414 is used as an anode electrode and the opposed electrode 420 is used as a cathode electrode. Also, the polarities of the electrodes may be applied in a reverse manner.

In a bottom emission type organic light emitting display device in which an image is presented in a direction toward the substrate 10, the pixel electrode 414 is a transparent electrode and the opposed electrode 420 is a reflection electrode. The reflection electrode may be formed by thinly depositing metal having a low work function, for example, Ag, Mg, Al, Pt, Pd, Au, Ni, Nd, Ir, Cr, Li, Ca, LiF/Ca, LiF/Al, or a compound thereof.

During each mask process for forming the above-described organic light emitting display device, a deposition layer may be removed by dry etching or wet etching. According to the bottom emission type organic light emitting display device according to the present embodiment, the effect of preventing the additional voltage drop and the generation of dispersion of resistance according to the position of a pad electrode due to metal undercut may be obtained.

Figure 12:
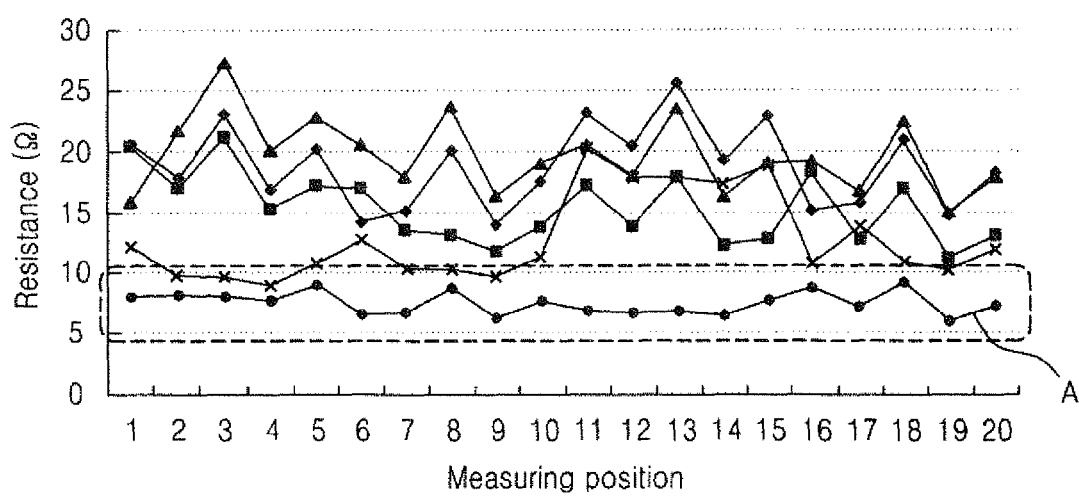
FIG. 12 is a graph showing a resistance measurement result of a conventional pad electrode compared to a resistance measurement result of a pad electrode according to the present invention.

FIG. 12 is a graph showing a resistance measurement result of a conventional pad electrode compared to a resistance measurement result of a pad electrode according to the present invention.

Referring to FIG. 12, line A indicates a result of measurement of resistance of a pad electrode according to the present invention and the other lines indicate a result of measurement of resistance of a pad electrode in a conventional pad electrode structure. As illustrated in FIG. 12, it can be seen that the resistance and positional dispersion are decreased in the pad electrode structure of the present invention, as compared to the conventional pad electrode structure.

Table 1 shows the result of measurement of luminance long range uniformity (LRU) of the conventional pad electrode compared to that of a pad electrode according to the present invention. As shown in Table 1, it can be seen that, when the pad electrode structure of the present invention is used, LRU increases over 20% compared to the conventional pad electrode structure.

TABLE 1

| | ELVdd Max Drop (V) | ELVss Max Drop (V) | Total Current (A) | Luminance LRU (%) |
|---|---|---|---|---|
| Conventional pad electrode | 0.3058 | 0.0228 | 0.97 | 64.20 |
| Pad electrode of the present invention | 0.1282 | 0.0268 | 1.15 | 84.24 |

In the above-described embodiment, an organic light emitting display device is described as an example. However, the present invention is not limited thereto, and a variety of display devices, including a liquid crystal display device, may be employed. Also, although one TFT and one capacitor are shown in the drawings which illustrate the embodiment according to the present invention, this is for convenience of explanation, and the present invention is not limited thereto. A plurality of TFTs and a plurality of capacitors may be included without increasing the number of mask processes according to the present invention.

As described above, with the organic light emitting display device according to the present invention, the manufacturing process is simplified, and patterning characteristic, an electrical characteristic, and a pad reliability of the pad unit are all satisfied.

While this invention has been particularly shown and described with reference to exemplary embodiments thereof, it will be understood by those skilled in the art that various changes in form and detail may be made therein without departing from the spirit and scope of the invention as defined by the appended claims.

What is claimed is:

1. An organic light emitting display device, comprising:
    a thin film transistor comprising an active layer, a gate electrode including a gate lower electrode and a gate upper electrode, a source electrode, and a drain electrode;
    an organic light emitting unit electrically connected to the thin film transistor, the organic light emitting unit comprising a pixel electrode formed of a same material and in a same layer as the gate lower electrode, an opposed electrode, and an intermediate layer comprised of a light emitting layer and interposed between the pixel electrode and the opposed electrode;
    a first pad electrode formed of the same material and in the same layer as the gate lower electrode;
    a second pad electrode formed on at least a part of the first pad electrode and formed of a same material and in a same layer as the gate upper electrode; and
    a third pad electrode contacting at least a part of the second pad electrode and formed of a same material and in a same layer as the source electrode.

2. The organic light emitting display device of claim 1, further comprising an interlayer insulation layer interposed between the second pad electrode and the third pad electrode, wherein the second pad electrode and the third pad electrode contact each other via a contact hole formed in the interlayer insulation layer.

3. The organic light emitting display device of claim 2, wherein the interlayer insulation layer exposes one end portion of the second pad electrode, and the third pad electrode is formed along the interlayer insulation layer and contacts one end portion of the exposed second pad electrode.

4. The organic light emitting display device of claim 1, wherein both end portions of the third pad electrode respectively contact both end portions of the second pad electrode.

5. The organic light emitting display device of claim 1, wherein one end portion of the first pad electrode is exposed to an outside and is electrically connected to a driver integrated circuit (IC) which supplies current to drive the organic light emitting display device.

6. The organic light emitting display device of claim 1, wherein the gate lower electrode, the pixel electrode, and the first pad electrode comprise at least one of ITO, IZO, ZnO, and $In_2O_3$.

7. The organic light emitting display device of claim 1, wherein the gate upper electrode and the second pad electrode comprise at least one material selected from a group consisting of Ag, Mg, Al, Pt, Pd, Au, Ni, Nd, Ir, Cr, Li, Ca, Mo, Ti, W, MoW, and Al/Cu.

8. The organic light emitting display device of claim 7, wherein the gate upper electrode and the second pad electrode comprise a tri-layer structure of molybdenum (Mo)-aluminum (Al)-molybdenum (Mo).

9. The organic light emitting display device of claim 1, wherein the source electrode, the drain electrode, and the third pad electrode comprise at least one material selected from a group consisting of Ag, Mg, Al, Pt, Pd, Au, Ni, Nd, Ir, Cr, Li, Ca, Mo, Ti, W, MoW, and Al/Cu.

10. The organic light emitting display device of claim 9, wherein the source electrode, the drain electrode and the third pad electrode comprise a tri-layer structure of molybdenum (Mo)-aluminum (Al)-molybdenum (Mo).

11. An organic light emitting display device, comprising:
    a first insulation layer formed on a substrate;
    an active layer of a thin film transistor formed on the first insulation layer;
    a second insulation layer covering the active layer;
    a pixel electrode formed on the second insulation layer;
    a gate lower electrode formed of a same material and in a same layer as the pixel electrode above the active layer by being separated by a predetermined distance from the pixel electrode;
    a first pad electrode formed of a same material and in a same layer as the gate lower electrode by being separated by a predetermined distance from the gate lower electrode;
    a gate upper electrode formed on the gate lower electrode;
    a second pad electrode formed of a same material and in a same layer as the gate upper electrode on the first pad electrode;
    a third insulation layer covering at least a part of the pixel electrode, the gate upper electrode and the second pad electrode;
    source and drain electrodes formed on the third insulation layer and contacting the pixel electrode; and
    a third pad electrode formed of a same material and in a same layer as the source and drain electrodes and contacting the second pad electrode.

12. The organic light emitting display device of claim 11, wherein the second pad electrode and the third pad electrode contact each other via a contact hole formed in the third insulation layer.

13. The organic light emitting display device of claim 12, wherein the third insulation layer exposes one end portion of the second pad electrode, and the third pad electrode is formed along the third insulation layer and contacts the exposed end portion of the second pad electrode.

14. The organic light emitting display device of claim 11, wherein both end portions of the third pad electrode respectively contact both end portions of the second pad electrode.

15. A method of manufacturing an organic light emitting display device, the method comprising the steps of:
    a first mask process operation for forming an active layer of a thin film transistor on a substrate;
    a second mask process operation for forming a gate electrode, a first pad electrode, a second pad electrode, and an electrode pattern which forms a pixel electrode above the active layer;
    a third mask process operation for forming an interlayer insulation layer having an opening which exposes both sides of the active layer, a part of the second pad electrode, and a part of the electrode pattern;
    a fourth mask process operation for forming source and drain electrodes contacting both exposed sides of the active layer, a third pad electrode contacting an exposed part of the second pad electrode, and the pixel electrode; and
    a fifth mask process operation for forming a pixel define layer which exposes at least a part of the pixel electrode.

16. The method of claim 15, wherein the second mask process operation comprises:
- sequentially depositing a second insulation layer, a first conductive layer, and a second conductive layer on the active layer;
- forming the gate electrode comprising the first conductive layer as a gate lower electrode and the second conductive layer as a gate upper electrode; and
- simultaneously forming a pad electrode comprising the first conductive layer as a first pad electrode and the second conductive layer as a second pad electrode by patterning the first conductive layer and the second conductive layer.

17. The method of claim 15, wherein the third mask process operation comprises:
- depositing a third insulation layer on the gate electrode, the second pad electrode and the electrode pattern; and
- forming an opening which exposes parts of source and drain regions of the active layer, a part of the second pad electrode, and a part of the electrode pattern by patterning the third insulation layer.

18. The method of claim 15, wherein the fourth mask process operation comprises:
- depositing a third conductive layer on an upper surface of the interlayer insulation layer; and
- forming the source and drain electrodes and the third pad electrode by patterning the third conductive layer.

19. The method of claim 18, wherein the second pad electrode and the third pad electrode contact each other via a contact hole formed in the interlayer insulation layer.

20. The method of claim 19, wherein the interlayer insulation layer exposes one end portion of the second pad electrode, and the third pad electrode is formed along the interlayer insulation layer and contacts the exposed end portion of the second pad electrode.

21. The method of claim 15, wherein the fifth mask process operation comprises:
- depositing a fourth insulation layer on an entire surface of the substrate; and
- forming the pixel define layer by patterning the fourth insulation layer.

* * * * *